(12) United States Patent
Zuehlsdorf et al.

(10) Patent No.: US 7,926,166 B2
(45) Date of Patent: Apr. 19, 2011

(54) METHOD OF MAKING AN ELECTROMAGNETIC INTERFERENCE SHIELD

(75) Inventors: Allan Zuehlsdorf, Sycamore, IL (US); Igor Vinokur, Skokie, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 290 days.

(21) Appl. No.: 12/353,048

(22) Filed: Jan. 13, 2009

(65) Prior Publication Data

US 2009/0119903 A1    May 14, 2009

Related U.S. Application Data

(63) Continuation of application No. 11/245,306, filed on Oct. 6, 2005, now Pat. No. 7,491,899.

(51) Int. Cl.
*H01F 7/06* (2006.01)

(52) U.S. Cl. ...... 29/602.1; 29/592.1; 174/372; 174/380; 174/382; 174/386; 361/800; 361/816; 361/818

(58) Field of Classification Search ............... 29/592.1, 29/602.1, 897.32; 174/372, 380, 382, 386; 361/800, 816, 818
See application file for complete search history.

(56) References Cited

U.S. PATENT DOCUMENTS

| | | | |
|---|---|---|---|
| 1,257,502 A | 2/1918 | Leighton | |
| 2,016,225 A | 10/1935 | Bukolt | |
| 4,008,419 A | 2/1977 | Stearley | |
| 4,754,101 A | 6/1988 | Stickney et al. | |
| 4,838,475 A | 6/1989 | Mullins et al. | |
| 4,890,199 A * | 12/1989 | Beutler | 361/818 |
| 4,922,059 A | 5/1990 | Walker et al. | |
| 5,095,177 A | 3/1992 | Johnson | |
| 5,153,379 A | 10/1992 | Guzuk et al. | |
| 5,354,951 A | 10/1994 | Lange, Sr. et al. | |
| 5,365,410 A | 11/1994 | Lonka | |
| 5,383,098 A | 1/1995 | Ma et al. | |
| 5,422,433 A | 6/1995 | Rivera et al. | |
| 5,436,802 A | 7/1995 | Trahan et al. | |
| 5,495,399 A | 2/1996 | Gore et al. | |
| 5,513,996 A | 5/1996 | Annerino et al. | |
| 5,530,202 A | 6/1996 | Dais et al. | |
| 5,539,150 A | 7/1996 | Kipka | |
| 5,566,055 A | 10/1996 | Salvi, Jr. | |
| 5,614,694 A | 3/1997 | Gorenz, Jr. et al. | |
| 5,844,784 A | 12/1998 | Moran et al. | |
| 5,886,879 A | 3/1999 | Matuschik | |
| 5,895,884 A | 4/1999 | Davidson | |
| 5,917,708 A * | 6/1999 | Moran et al. | 361/800 |
| 5,917,710 A | 6/1999 | Maatta | |

(Continued)

FOREIGN PATENT DOCUMENTS

CN    101278608 A    10/2008

(Continued)

*Primary Examiner* — Paul D Kim
(74) *Attorney, Agent, or Firm* — Harness, Dickey & Pierce, P.L.C.

(57) ABSTRACT

An electromagnetic interference (EMI) shield according to one embodiment generally includes a frame and a cover. The frame includes peripheral walls each having at least one folded portion forming an outer sidewall and an inner sidewall. The cover includes a lid portion and a plurality of edge portions extending downwardly from the lid portion. The shield includes at least one dimple configured to be engagingly received in at least one opening for releasably retaining the cover to the frame.

24 Claims, 8 Drawing Sheets

U.S. PATENT DOCUMENTS

| | | |
|---|---|---|
| 5,991,165 A | 11/1999 | Jones, Jr. et al. |
| 6,005,186 A | 12/1999 | Bachman |
| 6,043,983 A | 3/2000 | Taylor et al. |
| 6,049,469 A | 4/2000 | Hood, III et al. |
| 6,051,781 A | 4/2000 | Bianca et al. |
| 6,084,177 A | 7/2000 | Koradia et al. |
| 6,110,563 A | 8/2000 | Pienimaa et al. |
| 6,136,131 A | 10/2000 | Sosnowski |
| D434,771 S | 12/2000 | Ohtani |
| 6,175,077 B1 | 1/2001 | Mendolia et al. |
| 6,178,097 B1 | 1/2001 | Hauk, Jr. |
| 6,265,658 B1 | 7/2001 | Silvers |
| 6,274,808 B1 | 8/2001 | Cercioglu et al. |
| 6,313,400 B1 | 11/2001 | Mosquera et al. |
| 6,377,472 B1 | 4/2002 | Fan |
| 6,384,324 B2 | 5/2002 | Flegeo |
| 6,501,016 B1 | 12/2002 | Sosnowski |
| 6,552,261 B2 | 4/2003 | Shlahtichman et al. |
| 6,628,524 B1 | 9/2003 | Washino et al. |
| D484,508 S | 12/2003 | Crippen et al. |
| 6,711,032 B2 | 3/2004 | Sommer |
| 6,717,799 B2 | 4/2004 | Hamano et al. |
| 6,738,265 B1 | 5/2004 | Svarfvar et al. |
| 6,743,975 B2 | 6/2004 | Kolb |
| 6,744,640 B2 | 6/2004 | Reis et al. |
| 6,763,576 B2 | 7/2004 | Watchko et al. |
| 6,781,847 B2 | 8/2004 | Jakob et al. |
| 6,781,851 B2 | 8/2004 | Daoud et al. |
| 6,784,363 B2 | 8/2004 | Jones |
| 6,787,696 B2 | 9/2004 | Liljevik et al. |
| 6,870,091 B2 | 3/2005 | Seidler |
| D522,517 S | 6/2006 | Latawiec et al. |
| 7,084,356 B2 | 8/2006 | English et al. |
| D548,738 S | 8/2007 | Doyle et al. |
| D549,231 S | 8/2007 | Doyle et al. |
| D549,706 S | 8/2007 | Doyle et al. |
| 7,504,592 B1 * | 3/2009 | Crotty, Jr. .................... 174/372 |
| 2002/0185294 A1 | 12/2002 | Shlyakhtichman et al. |
| 2003/0067757 A1 | 4/2003 | Richardson et al. |
| 2004/0012939 A1 | 1/2004 | Ta et al. |
| 2005/0045358 A1 | 3/2005 | Arnold |

FOREIGN PATENT DOCUMENTS

| | | |
|---|---|---|
| EP | 0726700 A1 | 8/1996 |
| JP | 6-21663 | 1/1994 |
| WO | WO 98/54942 | 12/1998 |

* cited by examiner

METHOD OF MAKING AN ELECTROMAGNETIC INTERFERENCE SHIELD

CROSS-REFERENCE TO RELATED APPLICATION

This application is a continuation of U.S. patent application Ser. No. 11/245,306 filed Oct. 6, 2005 (now U.S. Pat. No. 7,491,899 issued Feb. 17, 2009). The entire disclosure the above application is incorporated herein by reference in its entirety.

FIELD OF THE INVENTION

The present invention relates to multi-piece shields for shielding components on a printed circuit board from electromagnetic interference (EMI)/radio frequency interference (RFI).

BACKGROUND OF THE INVENTION

Electronic equipment may include electrical components and circuits mounted on a substrate that can be sensitive to electromagnetic interference (EMI) and radio frequency interference (RFI). Such EMI/RFI interference may originate from internal sources within the electronic equipment or from external sources. Interference can cause degradation or complete loss of important signals, rendering the electronic equipment inefficient or inoperable. Accordingly, the circuits (sometimes referred to as RF modules or transceiver circuits) should include EMI/RFI shielding in order to function properly. This shielding reduces interference not only from external sources, but also from various functional blocks within the module.

Accordingly, electronic circuits or components of a printed circuit board (PCB) are often shielded with shields that are soldered or otherwise affixed to the PCB, thus increasing the overall size of the PCB. Soldered shields, however, may need to be removed to repair or replace the covered component, which can be an expensive and time consuming task that can even cause damage to the PCB.

SUMMARY OF THE INVENTION

According to one aspect, the present invention provides EMI shields. In one particular embodiment, the EMI shield generally includes a frame and a cover. The frame includes peripheral walls each having at least one folded portion forming an outer sidewall and an inner sidewall. The cover includes a lid portion and a plurality of edge portions extending downwardly from the lid portion. The shield includes at least one dimple configured to be engagingly received in at least one opening for releasably retaining the cover to the frame.

According to another aspect, the present invention provides methods of making EMI shields. In one exemplary embodiment, a method generally includes stamping in a single piece of material a flat pattern partial profile for a frame and a cover. The profile for the frame includes having at least one dimple or opening. The profile for the cover includes a plurality of edge portions having at least one of the other of the dimple and the opening. The profile for the cover is disposed within the area generally defined between the frame's peripheral walls. The method also includes forming at least one folded portion in at least one peripheral wall of the frame to thereby provide the at least one peripheral wall with an outer sidewall and an inner sidewall such that the inner sidewall includes the at least one of the dimple and the opening folded over and engaged with the at least one of the other of the dimple and the opening of the cover. The method further includes bending the frame's peripheral walls and the cover's edge portions generally perpendicular to the cover, and stamping to remove the remaining material connecting the frame to the cover to thereby form two separable frame and cover pieces, whereby the cover is releasably retained to the frame by the engagement of the dimple with the opening.

In another embodiment, a method of making an EMI shield generally includes stamping in a single piece of material a flat pattern partial profile for a frame and a cover. The profile for the frame includes peripheral walls each having at least one opening therein. The profile for the cover includes edge portions each having at least one dimple formed therein. The profile for the cover is disposed within the area defined generally within the frame peripheral walls. The method also includes forming bends in the frame's peripheral walls to thereby form at least one tab surface generally perpendicular to the peripheral walls, and forming folded portions in the frame's peripheral walls to thereby provide the peripheral walls with an outer sidewall and an inner sidewall such that the inner sidewalls include the openings folded over and engaged with the dimples of the cover's edge portions. The method further includes bending the frame's peripheral walls and the cover's edge portions generally perpendicular to the cover, and stamping to remove the remaining material connecting the frame to the cover to thereby form two separable frame and cover pieces, whereby the cover is releasably retained to the frame by the engagement of the dimples with the openings.

In another embodiment, a method of making an EMI shield generally includes forming outer portions of a blank generally inwardly about one hundred eighty degrees to thereby form a frame's outer and inner sidewalls, and forming upper portions of the frame's inner sidewalls outwardly about ninety degrees to thereby form surfaces generally perpendicular to the frame's inner sidewalls. The method also includes forming the frame's inner and outer sidewalls and portions of the blank defining a cover's edge portions inwardly about ninety degrees, and severing the remaining material of the blank connecting the frame to the cover to thereby form two separable frame and cover pieces.

Further areas of applicability and aspects of the present invention will become apparent from the detailed description provided hereinafter. It should be understood that the detailed description and specific examples, while indicating exemplary embodiments of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE EXEMPLARY EMBODIMENTS

Figure 1:
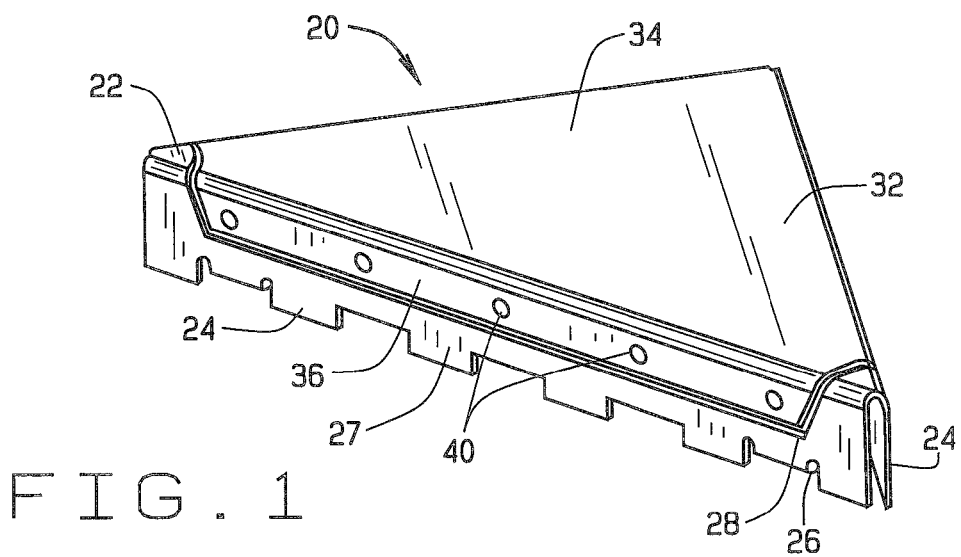
FIG. 1 is a perspective view of an exemplary EMI shield including a frame and a cover shown assembled onto the frame according to one embodiment of the invention.

The following description of the exemplary embodiments is merely exemplary in nature and is in no way intended to limit the invention, its application, or uses.

According to one aspect, the present invention provides EMI shields. In one particular embodiment, the EMI shield generally includes a frame and a cover. The frame includes peripheral walls each having at least one folded portion forming an outer sidewall and an inner sidewall. The cover includes a lid portion and a plurality of edge portions extending downwardly from the lid portion. The shield includes at least one dimple configured to be engagingly received in at least one opening for releasably retaining the cover to the frame.

According to another aspect, the present invention provides methods of making EMI shields. In one exemplary embodiment, a method generally includes stamping in a single piece of material a flat pattern partial profile for a frame and a cover. The profile for the frame includes having at least one dimple or opening. The profile for the cover includes a plurality of edge portions having at least one of the other of the dimple and the opening. The profile for the cover is disposed within the area generally defined between the frame's peripheral walls. The method also includes forming at least one folded portion in at least one peripheral wall of the frame to thereby provide the at least one peripheral wall with an outer sidewall and an inner sidewall such that the inner sidewall includes the at least one of the dimple and the opening folded over and engaged with the at least one of the other of the dimple and the opening of the cover. The method further includes bending the frame's peripheral walls and the cover's edge portions generally perpendicular to the cover, and stamping to remove the remaining material connecting the frame to the cover to thereby form two separable frame and cover pieces, whereby the cover is releasably retained to the frame by the engagement of the dimple with the opening.

In another embodiment, a method of making an EMI shield generally includes stamping in a single piece of material a flat pattern partial profile for a frame and a cover. The profile for the frame includes peripheral walls each having at least one opening therein. The profile for the cover includes edge portions each having at least one dimple formed therein. The profile for the cover is disposed within the area defined generally within the frame peripheral walls. The method also includes forming bends in the frame's peripheral walls to thereby form at least one tab surface generally perpendicular to the peripheral walls, and forming folded portions in the frame's peripheral walls to thereby provide the peripheral walls with an outer sidewall and an inner sidewall such that the inner sidewalls include the openings folded over and engaged with the dimples of the cover's edge portions. The method further includes bending the frame's peripheral walls and the cover's edge portions generally perpendicular to the cover, and stamping to remove the remaining material connecting the frame to the cover to thereby form two separable frame and cover pieces, whereby the cover is releasably retained to the frame by the engagement of the dimples with the openings.

In another embodiment, a method of making an EMI shield generally includes forming outer portions of a blank generally inwardly about one hundred eighty degrees to thereby form a frame's outer and inner sidewalls, and forming upper portions of the frame's inner sidewalls outwardly about ninety degrees to thereby form surfaces generally perpendicular to the frame's inner sidewalls. The method also includes forming the frame's inner and outer sidewalls and portions of the blank defining a cover's edge portions inwardly about ninety degrees, and severing the remaining material of the blank connecting the frame to the cover to thereby form two separable frame and cover pieces.

Other aspects include methods of using such shields, and methods of making such shields. Further aspects relate to the subcomponents of such shields including the frames, covers, and methods of making the subcomponents. Any of the aspects of the present invention can be used individually or in combination with any one or more of the other aspects of the present invention.

FIG. 1 illustrates an exemplary embodiment of an EMI shield according to the principles of the present invention. As shown in FIG. 1, the EMI shield 20 includes a frame 22 and a removable cover 32. The cover 32 is assembled onto the frame 22, but can be readily removed as described herein.

Figure 2:
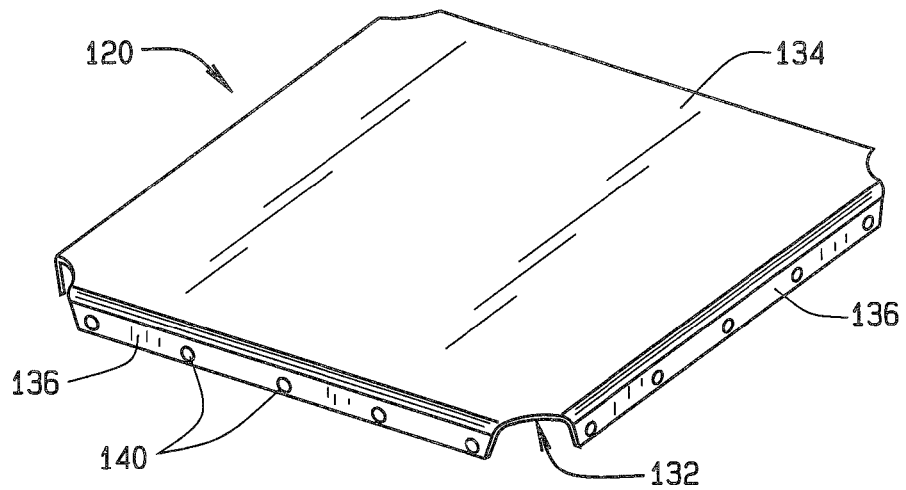
FIG. 2 is an exploded perspective view of an EMI shield according to another exemplary embodiment of the invention.
Figure 2:
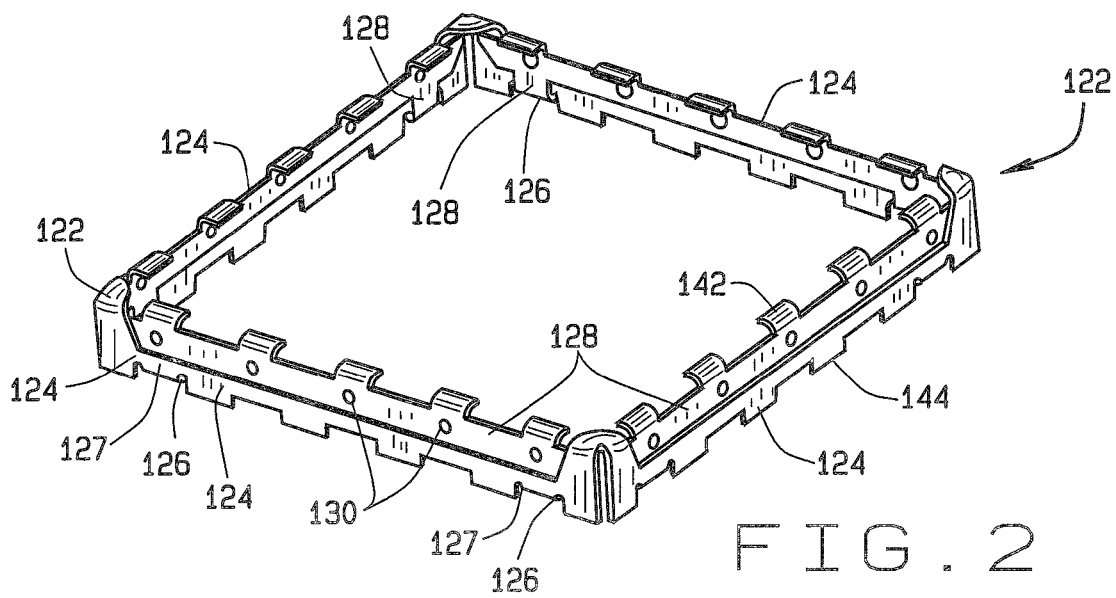

The frame 22 includes peripheral walls 24. Each wall 24 includes at least one folded portion 26 that provides each peripheral wall 24 with an outer sidewall 27 and an inner sidewall 28. While the frame 22 shown in FIG. 1 includes three peripheral walls 24 in a generally triangular configuration, other embodiments can include a frame having more or less than three peripheral walls and/or peripheral walls in a non-triangular configuration (e.g., rectangular, circular, etc.). For example, FIG. 2 illustrates an EMI shield 120 including a frame 122 with four peripheral walls 124 arranged in a generally rectangular configuration.

With continued reference to FIG. 1, each of the frame's inner sidewalls 28 includes openings for receiving corresponding dimples 40 of the cover 32. In this particular embodiment, each of the frame's inner sidewalls 28 includes five circular through-holes. Alternative embodiments include more or less than five openings (and in some cases no openings) in each frame inner sidewall, and/or openings that do not extend completely through the inner sidewalls. Plus, each of the frame's inner sidewalls does not need to include the same number of openings as the other inner sidewalls of the frame. In yet other embodiments, one or more of the openings in the frame inner sidewalls may be configured with a non-circular shape, such as a relatively oblong opening, slot, notch, hole, recess, rectangular opening, etc.

The shield 20 also includes the cover 32 that can be removably attached to the frame 22. The cover 32 includes a lid portion 34 and edge portions 36 extending downwardly from the lid portion 34. The edge portions 36 include dimples, detents or protrusions 40 configured to be engagingly received in the openings in the frame's inner sidewalls 28. In the illustrated embodiment shown in FIG. 1, each of the cover's edge portions 36 includes five dimples 40 configured to be engagingly received in the corresponding openings in the frame's inner sidewalls 28. Alternatively, other embodiments can include a cover having more or less than five dimples (and in some cases no dimples) on each of the cover's edge portions. Plus, each cover edge portion does not need to include the same number of dimples as the cover's other edge portions. In yet other embodiments, one or more of the dimples may be engagingly received in an opening other than a circular through-hole, such as a relatively long opening or slot in a frame inner sidewall.

The shield 20 and its dimples 40 are configured (e.g., shaped, sized, and spaced apart from one another on the edge portions 36) such that the dimples 40 can be slid over the frame's inner sidewalls 28 to engage the openings of the frame's inner sidewalls 28. In one exemplary embodiment, the cover's edge portions 36 may flex outwardly and/or the frame's peripheral walls 24 may flex inwardly as the dimples 40 are slid over the frame's inner sidewalls 28 for engaging the openings. In this exemplary manner, the cover 32 can thus be releasably retained to the frame 22 by the engagement of the dimples 40 within the openings in the frame's inner sidewalls 28. This, in turn, provides an EMI shield 20 having a cover 32 that may be readily removed from the frame 22, for example, to allow access to components under the cover 32. The cover 32 may subsequently be reattached to the frame 22, or a new cover 32 may be assembled onto the frame 22. Accordingly, various embodiments of the present invention can help avoid the access problems associated with soldered shields by providing shields that can be readily opened when repair work is necessary or desired.

In various embodiments, the cover 32 and dimples 40 can be integrally or monolithically formed as a single component. One exemplary implementation stamps the dimples 40 into the cover 32. Other suitable manufacturing processes besides stamping can also be used to integrally form the cover and the dimples as a single component.

Even though the dimples 40 can be formed integrally with the cover 32, such is not required. In other embodiments, the dimples 40 may comprise discrete components that are separately engaged to the cover 32 (or to the frame 22 as the case may be), for example, by welding, among other suitable methods.

While FIG. 1 shows the cover 32 including only dimples 40 and the frame 22 including only openings, such is not required. Other embodiments can include the frame having one or more dimples, and the cover having one or more openings. In further embodiments, different combinations of dimples and openings can be defined by either or both the frame and the cover depending on the particular application.

A wide range of materials can be used for the shield 20. In one embodiment, the frame 22 and cover 32 are both formed of cold rolled steel or stainless steel. Alternatively, the frame 22 and cover 32 may be made of nickel-silver alloy, tin-plated cold rolled steel, carbon steel, or other suitable electrically conductive and/or non-magnetic material suitable for use as an EMI shield.

FIG. 2 illustrates another embodiment of an EMI shield 120. As shown, the shield 120 includes a frame 122 and a cover 132 removably attached to the frame 122. The frame 122 includes one or more peripheral walls 124. Each wall 124 includes a folded portion 126 bent inwardly to form generally vertical outer and inner sidewalls 127 and 128. The outer and inner sidewalls 127 and 128 are generally parallel with one another. The outer sidewall 127, folded portion 126, and inner sidewall 128 collectively have or define a generally U-shaped profile, although other configurations are also possible in other embodiments.

While the frame 122 shown in FIG. 2 includes four peripheral walls 124 in a generally rectangular configuration, other embodiments can include a frame having more or less than four peripheral walls and/or peripheral walls in a non-rectangular configuration (e.g., triangular, hexagonal, circular, etc.). For example, FIG. 1 illustrates an EMI shield 20 including a frame 22 with three peripheral walls 24 arranged in a generally triangular configuration.

With continued reference to FIG. 2, each of the frame's inner sidewalls 128 includes openings 130 for receiving corresponding dimples, detents, or protrusions 140 of the cover 132. In this particular embodiment, each of the frame's inner sidewalls 128 includes five circular through-holes 130. Alternative embodiments include more or less than five openings (and in some cases no openings) in an inner sidewall, and/or openings that do not extend completely through the inner sidewalls. Plus, each of the frame's inner sidewalls does not need to include the same number of openings as the other inner sidewalls of the frame. In yet other embodiments, one or more of the openings in the frame inner sidewalls may be configured with a non-circular shape, such as a relatively oblong opening, slot, notch, hole, recess, rectangular opening, etc.

The shield 120 also includes the cover 132 that can be removably attached to the frame 122. The cover 132 includes a lid portion 134 and edge portions 136 extending downwardly from the lid portion 134. The edge portions 136 include dimples 140 configured to be engagingly received in the openings 130 in the frame's inner sidewalls 128. In the illustrated embodiment shown in FIG. 2, each of the cover's edge portions 136 includes five dimples 140 configured to be engagingly received in the corresponding openings 130 in the frame's inner sidewalls 128. Alternatively, other embodiments can include a cover having more or less than five dimples (and in some cases no dimples) on each of the cover's edge portions. Plus, each cover edge portion does not need to include the same number of dimples as the cover's other edge portions. In yet other embodiments, one or more of the dimples may be engagingly received in an opening other than a circular through-hole, such as a relatively long opening or slot in a frame inner sidewall.

The shield 120 and its dimples 140 are configured (e.g., shaped, sized, and spaced apart from one another on the edge portions 136) such that the dimples 140 can be slid over the frame's inner sidewalls 128 to engage the openings 130 of the frame's inner sidewalls 128. In one exemplary embodiment, the cover's edge portions 136 may flex outwardly and/or the frame's peripheral walls 124 may flex inwardly as the dimples 140 are slid over the frame's inner sidewalls 128 for engaging the openings 130. The cover 132 can thus be releasably retained to the frame 122 by the engagement of the dimples 140 within the openings 130 in the frame's inner sidewalls 128. This, in turn, provides an EMI shield 120 having a cover 132 that may be readily removed from the frame 122, for example, to allow access to components under the cover 132. The cover 132 may subsequently be reattached to the frame 122, or a new cover 132 may be assembled onto the frame 122. Accordingly, various embodiments of the present invention can help avoid the access problems associated with soldered shields by providing shields that can be readily opened when repair work is necessary or desired.

In various embodiments, the cover 132 and dimples 140 can be integrally or monolithically formed as a single component. One exemplary implementation stamps the dimples 140 into the cover 132. Other suitable manufacturing processes besides stamping can also be used to integrally form the cover and the dimples as a single component.

Even though the dimples 140 can be formed integrally with the cover 132, such is not required. In other embodiments, the dimples 140 may comprise discrete components that are separately engaged to the cover 132 (or to the frame 122 as the case may be), for example, by welding, among other suitable methods.

While FIG. 2 shows the cover 132 including only dimples 140 and the frame 122 including only openings 130, such is not required. Other embodiments can include the frame having one or more dimples, and the cover having one or more openings. In further embodiments, different combinations of dimples and openings can be defined by either or both the frame and the cover depending on the particular application.

A wide range of materials can be used for the shield 120. In one embodiment, the frame 122 and cover 132 are both formed of cold rolled steel or stainless steel. Alternatively, the frame 122 and cover 132 may be made of nickel-silver alloy, tin-plated cold rolled steel, carbon steel, or other suitable electrically conductive and/or non-magnetic material suitable for use as an EMI shield.

In various embodiments, the cover portion 132 may be easily removed from and reattached to the frame 122. In one particular embodiment, the shield 120 is configured such that its cover 132 may be releasably removed from the frame 122 when a force in the range of about one pound to about five pounds is applied to the cover 132. This allows the cover 132 to be easily removed from the frame 122, for example, to permit rework or replacement of electrical components that may lie under the cover 132 on a printed circuit board, without requiring any severing or breaking off of a separate portion of the cover. By virtue of the low force required to remove the cover, the cover is also removable without the use of tools in some embodiments.

In various embodiments, the contact established between the cover 132 and the frame 122 provides an effective amount of electrical conduction between the cover 132 and the frame 122 for conducting electromagnetic energy absorbed by the shield to a ground plane on a printed circuit board.

In various embodiments, the frame's inner sidewalls 128 can also be configured to close off or seal the interface or open area generally between the cover's edge portions 136 and the frame's outer sidewalls 127. This feature can substantially eliminate (or at least reduce) gaps between the cover's edge portions 136 and the frame's outer sidewalls 127. This, in turn, can inhibit electromagnetic energy from passing through or leaking out of the gaps or interfaces, thus providing better shielding.

In various embodiments, the cover 132 when releasably retained to the frame 122 can provide an EMI shield 120 with a height of not more than about four millimeters, while providing accessibility to objects that are enclosed beneath the removable cover 132 of the EMI shield 120. In one particular embodiment, a shield having a height of about three millimeters is provided. In another embodiment, a shield having a height of about six millimeters is provided.

Accordingly, various embodiments of the present invention can provide an EMI shield with a removable cover with reduced gaps or spaces for inadvertent escape of electromagnetic interference between the frame and the cover. The dimensions set forth in this paragraph (as are all dimensions herein) are provided for illustrative purposes only, and not for purposes of limitation.

In various embodiments, each inner sidewall 128 may further comprise at least one folded upper surface 142 that is generally perpendicular to the inner sidewall 128. The at least one upper surface 142 is spaced above the at least one opening 130 in the inner sidewall 128 such that the lid portion 134 of the cover 132 contacts the at least one upper surface 142 when each dimple 140 is received within the at least one opening 130 in each inner sidewall 128. This, in turn, may help retain the cover 132 to the frame 122 in a more secure manner.

In the embodiment shown in FIG. 2, each inner sidewall 128 includes five upper surfaces 142 which are generally perpendicular to the inner sidewall 128. Alternative embodiments may include more or less than five upper surfaces 142 (and in some cases no such upper surfaces) generally perpendicular to the inner sidewall 128.

The frame 122 shown in FIG. 2 includes perimeter walls 124 having mounting feet 144 for contacting one or more components of a printed circuit board (not shown) to establish or provide for electrical contact with the printed circuit board. The dimples 140 can help establish electrical conduction between the cover 132 and the frame's inner sidewalls 128. Where the inner sidewalls 128 include at least one upper surface 142 perpendicular to the inner sidewall 128, electrical contact can also be established between the inner surface or underside of the cover's lid portion 134 and the at least one upper surface 142 of the frame's inner sidewall 128.

Figure 3:
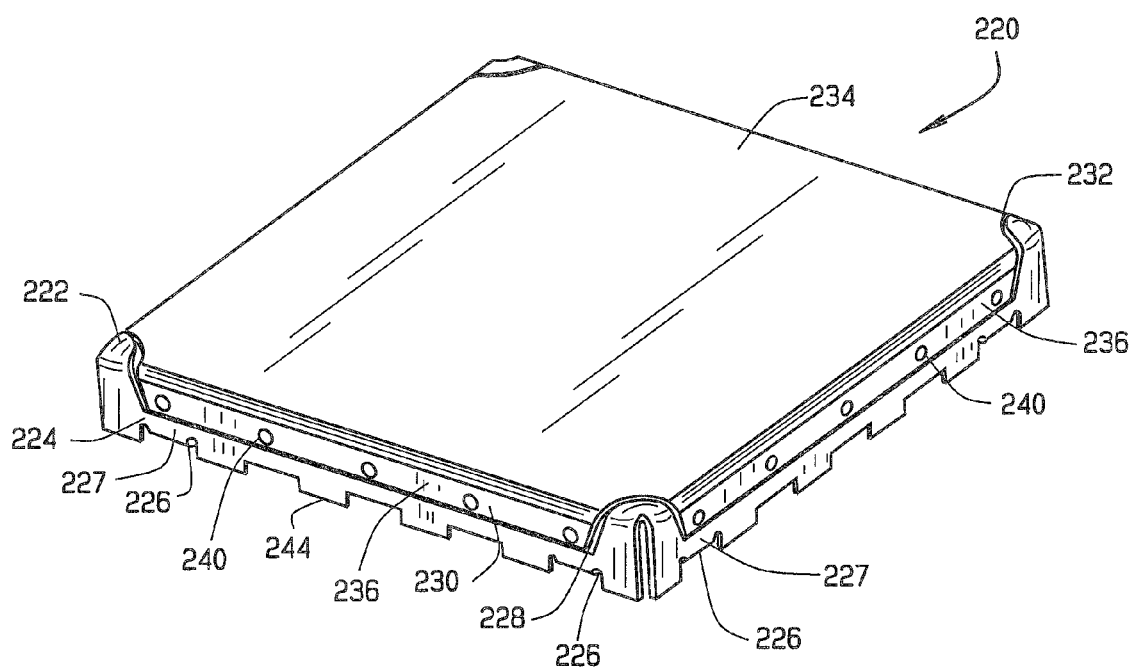
FIG. 3 is a perspective view of an EMI shield including a frame and a cover shown assembled onto the frame according to another exemplary embodiment of the invention.
Figure 4:
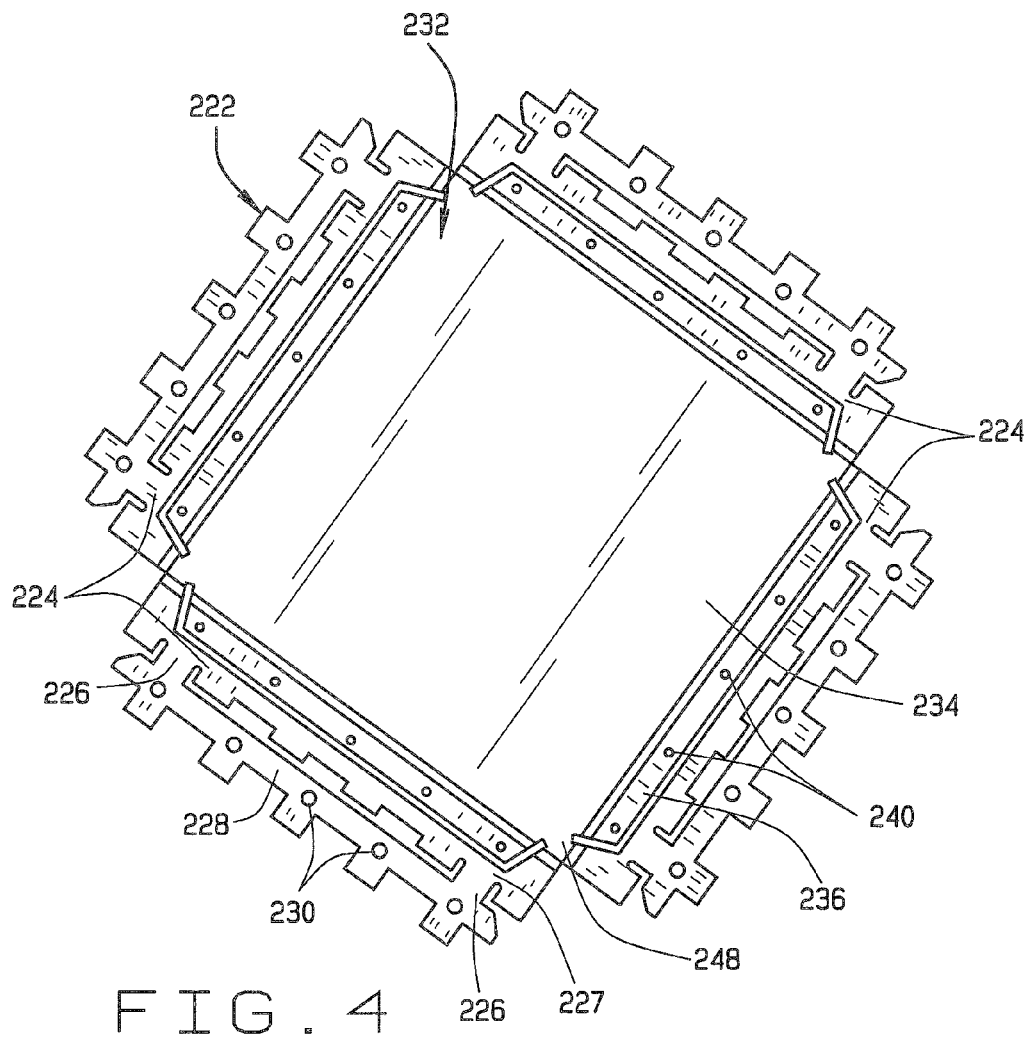
FIG. 4 is a plan view of a blank including a flat pattern partial profile that can be used to make the EMI shield shown in FIG. 3 according to one exemplary embodiment of the invention.
Figure 5:
FIG. 5 is a cutaway view of the EMI shield shown in FIG. 3.
Figure 6:
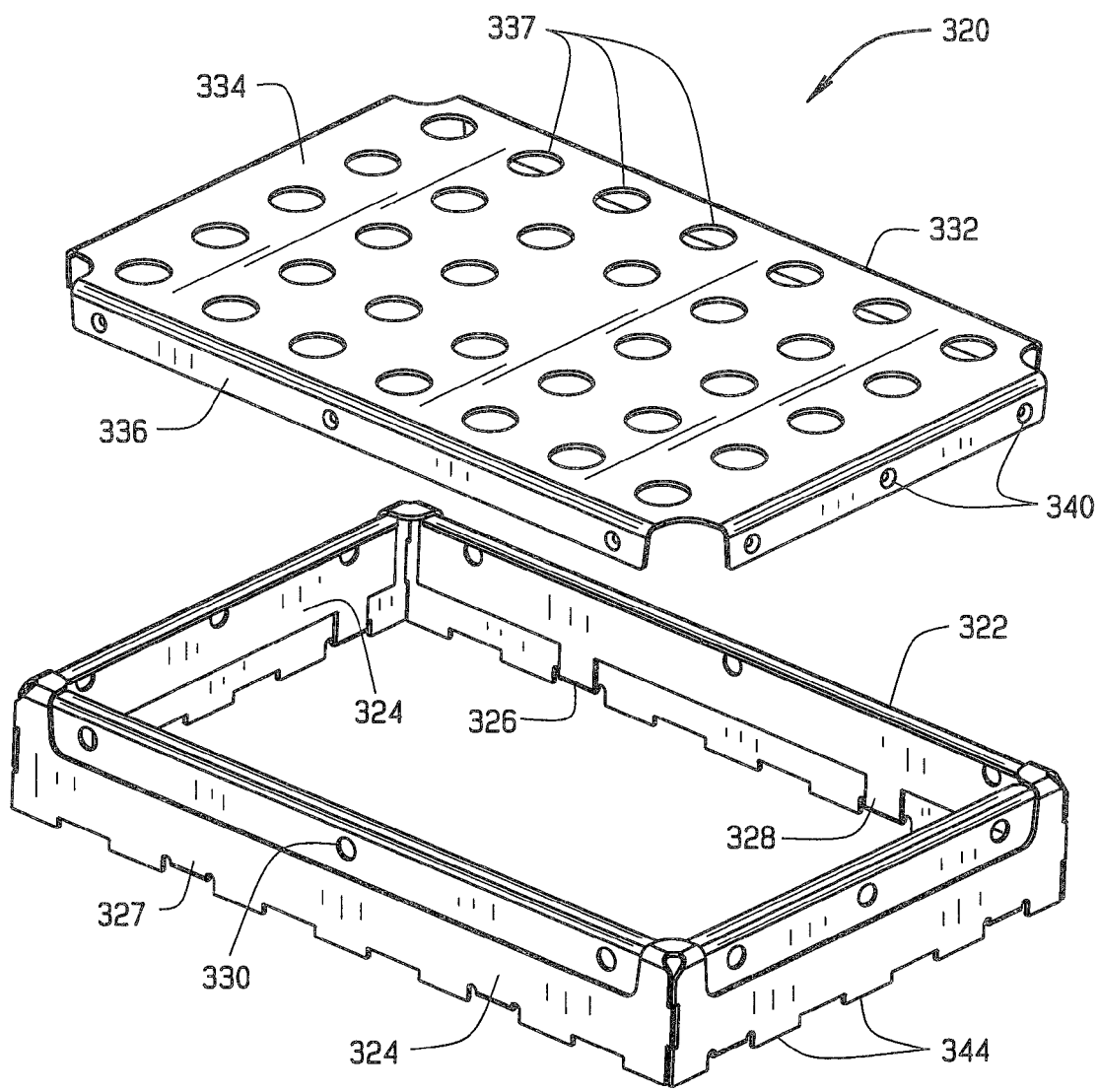
FIG. 6 is an exploded perspective of view of an EMI shield according to another exemplary embodiment of the invention.
Figure 7:
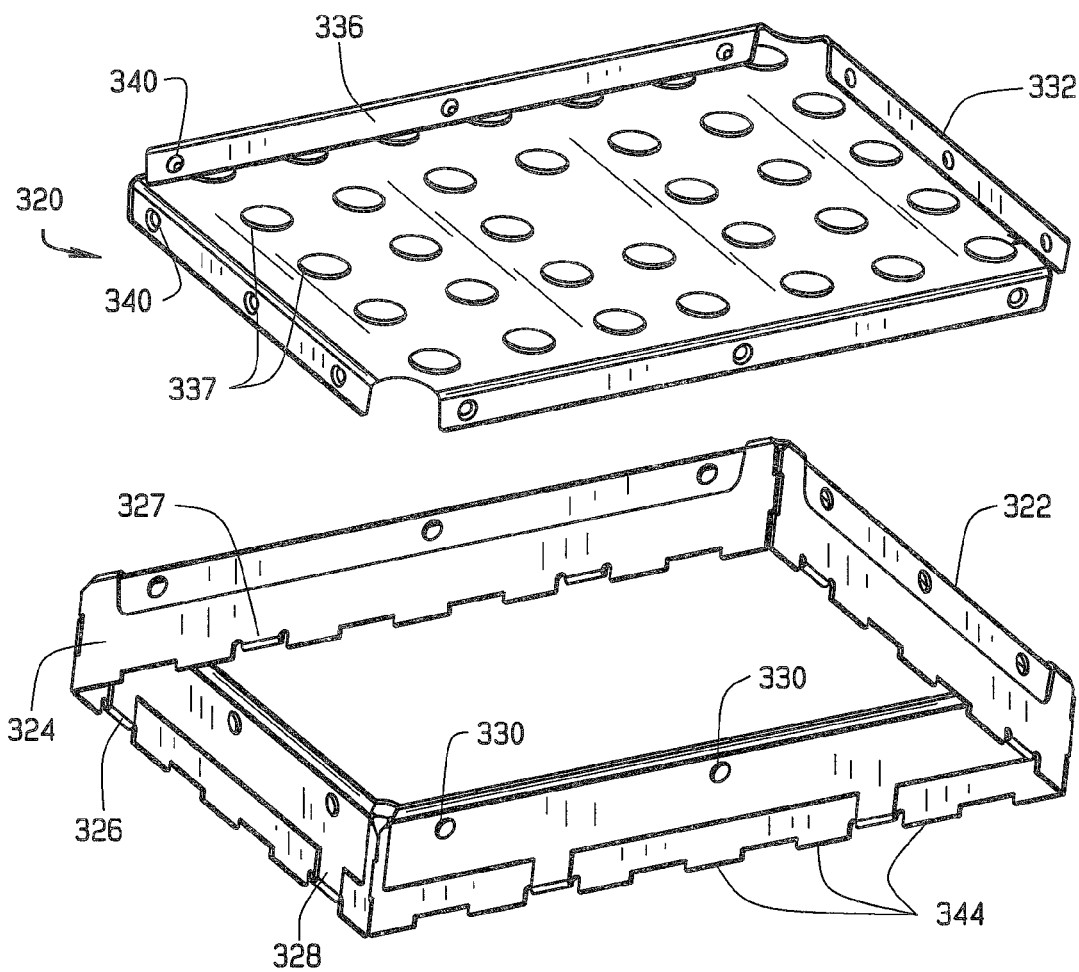
FIG. 7 is a lower exploded perspective view of the EMI shield shown in FIG. 7.
Figure 8:
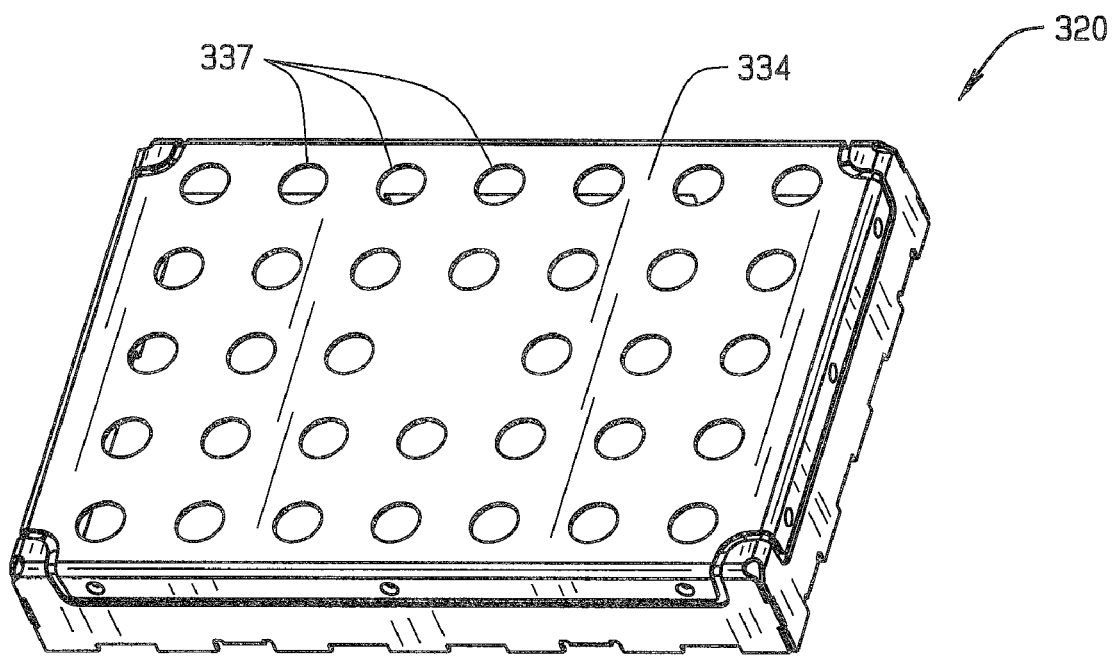
FIG. 8 is a perspective view of the EMI shield shown in FIG. 6 with the cover shown assembled onto the frame.
Figure 9:
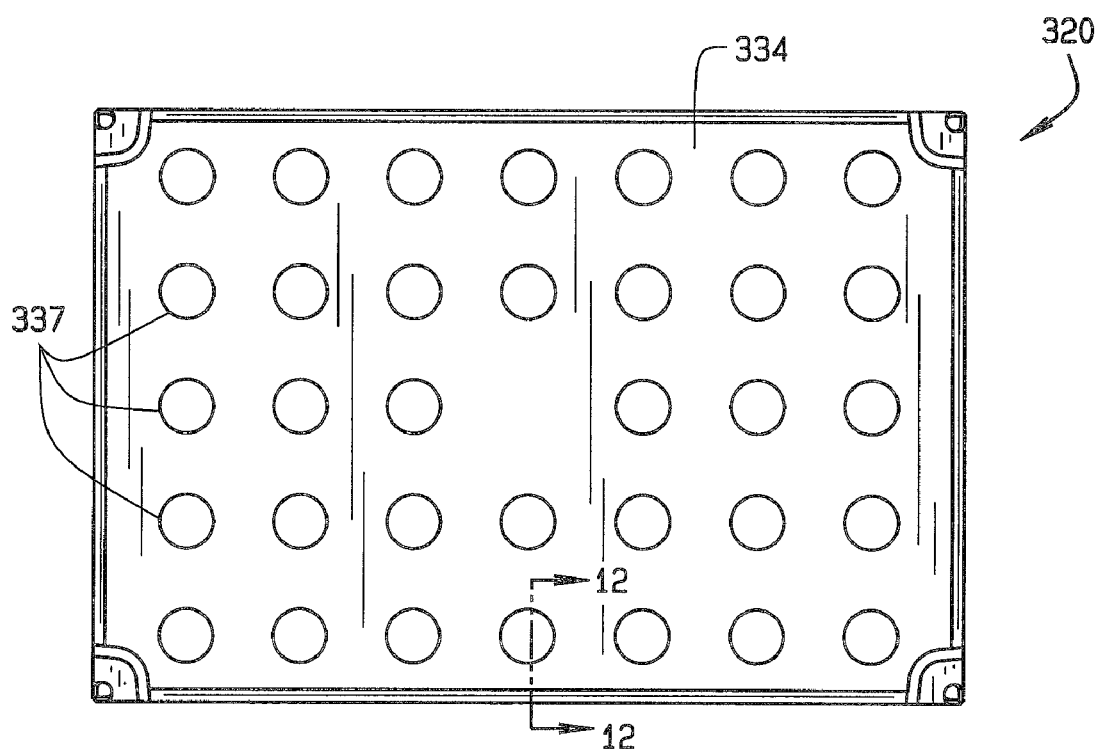
FIG. 9 is an upper view of the EMI shield shown in FIG. 8.
Figure 10:
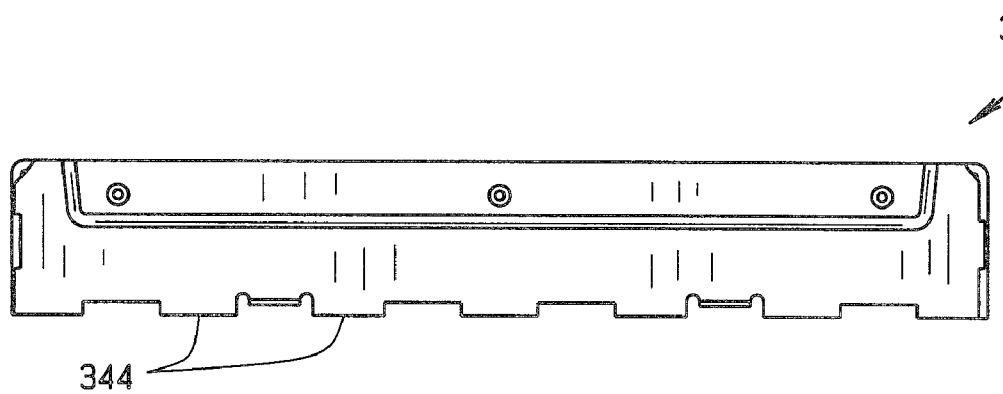
FIG. 10 is a front side elevation view of the EMI shield shown in FIG. 8.
Figure 11:
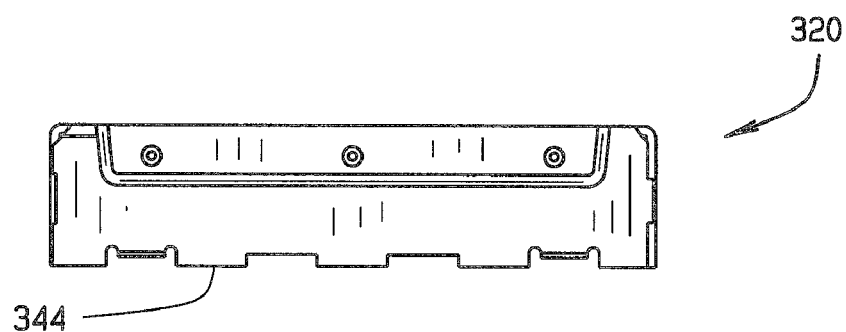
FIG. 11 is a end elevation view of the EMI shield shown in FIG. 8.
Figure 12:
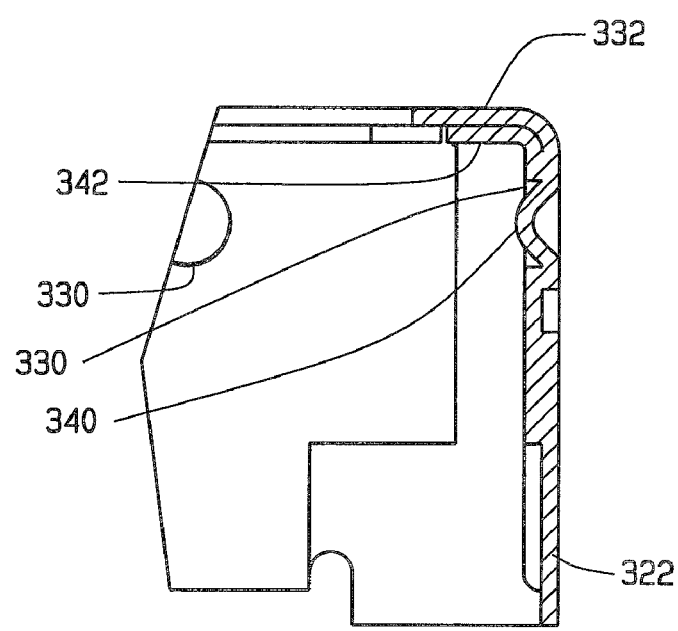
FIG. 12 is a partial cross-sectional view of the EMI shield taken along the line 12-12 in FIG. 9.

With reference now to FIGS. 3 through 5, various embodiments of an EMI shield 220 include a frame 222 and a cover 232. As shown, the frame 222 includes four perimeter walls 224 in a generally rectangular configuration and a top having an opening therein.

The frame's perimeter walls 224 include mounting feet 244. The mounting feet 244 can be formed as an integral part of each frame wall 224. The mounting feet 244 can be generally tapered and provide a mounting surface for mating with a ground plane or trace pad on a printed circuit board.

The cover 232 of the shield 220 has a generally rectangular planar top 234 and four edge portions 236 extending downwardly therefrom. The cover's edge portions 236 include laterally spaced detents or dimples 240.

As shown in FIG. 5, each of the frame's perimeter walls 224 includes a folded portion 226 that is bent inwardly to form generally vertical outer and inner sidewalls 227 and 228. These sidewalls 227 and 228 are generally parallel to one another. The outer sidewall 127, folded portion 126, and inner sidewall 128 collectively have or define a generally U-shaped profile, although other configurations are also possible in other embodiments.

The frame's inner sidewalls 228 include laterally spaced openings 230 therein. The openings 230 are appropriately positioned and configured to respectively receive the laterally spaced dimples 240 on the cover's edge portions 236. The dimples 240 on the cover's edge portions 236 are adapted to slide snugly over the inner sidewalls 228 of the frame 222, and into the corresponding openings 230 in the frame's inner sidewalls 228 to releasably retain the cover 232 to the frame 222. In one exemplary embodiment, the cover's edge portions 236 may flex outwardly and/or the frame's peripheral walls 224 may flex inwardly as the dimples 240 are slid over the frame's inner sidewalls 228 for engaging the openings. In this exemplary manner, the cover 232 can thus be releasably retained to the frame 222 by the engagement of the dimples 240 within the openings in the frame's inner sidewalls 228.

In this particular embodiment, each of the frame's inner sidewalls 228 includes five circular through-holes. Alternative embodiments include more or less than five openings (and in some cases no openings) in each frame inner sidewall, and/or openings that do not extend completely through the inner sidewalls. Plus, each of the frame's inner sidewalls does not need to include the same number of openings as the other inner sidewalls of the frame. In yet other embodiments, one or more of the openings in the frame inner sidewalls may be configured with a non-circular shape, such as a relatively oblong opening, slot, notch, hole, recess, rectangular opening, etc.

In the illustrated embodiment shown in FIG. 3, each of the cover's edge portions 236 includes five dimples 240 configured to be engagingly received in the corresponding openings in the frame's inner sidewalls 228. Alternatively, other embodiments can include a cover having more or less than five dimples (and in some cases no dimples) on each of the cover's edge portions. Plus, each cover edge portion does not need to include the same number of dimples as the cover's other edge portions. In yet other embodiments, one or more of the dimples may be engagingly received in an opening other than a circular through-hole, such as a relatively long opening or slot in a frame inner sidewall.

While FIG. 3 shows the cover 232 including only dimples 240 and the frame 222 including only openings, such is not required. Other embodiments can include the frame having one or more dimples, and the cover having one or more openings. In further embodiments, different combinations of dimples and openings can be defined by either or both the frame and the cover depending on the particular application.

The top surface of the frame 222 also helps to establish good electrical contact with the underside of the cover's planar top 234 when the cover 232 is retained on the frame 222 via the engagement of the dimples 240 and openings 230. The contact area established between the cover's planar top 234 and the frame 222 can help form an electrically conductive pathway that provides an effective amount of electrical conduction between the cover 232 and frame 222 for conducting electromagnetic energy absorbed by the shield 220 through the mounting feet 244 to a ground plane on a printed circuit board.

The frame 222 may be made of a material suitable for soldering the feet 244 to traces on a printed circuit board. Exemplary materials for the frame 222 include cold rolled steel or nickel-silver alloy. Alternative materials for the frame 222 include carbon steel, stainless steel, tin-plated cold rolled steel, etc.

While feet 244 of the frame 222 can be soldered to a printed circuit board (PCB), the frame 222 may also be affixed to a circuit board by any suitable manner desired, such as adhesives, mechanical fasteners, clips, etc. In one embodiment, the frame 222 may be attached to a PCB via soldering the mounting feet 244 to grounded traces positioned on the PCB substrate and/or around the electrical circuits generating (or requiring protection from) electromagnetic interference as well as around the electrical circuits that are susceptible to interference.

In another aspect of the present invention, a shield (e.g., 20, 120, 220, 320, etc.) may be fabricated from a single blank of material to provide a cover (e.g., 32,132, 232, 332, etc.) adapted to be releasably attached to a frame (e.g., 22,122, 222, 322, etc.). In the illustrated embodiment of FIGS. 3 through 5, the frame 222 and the cover 232 are sized such that the cover 232 may be nested in the area of material within the frame 222, thereby allowing the frame 222 and cover 232 to be substantially simultaneously fabricated from the same single blank or strip of material.

Other embodiments of an EMI shield may include a plurality of carrying corners (e.g., tabs at the corners, etc.) to permit fabrication of the shield 220 through a progressive die stamping process. In such embodiments, the carrying corners may allow the frame 222 being stamped to be retained within the raw material strip that is fed through the progressive die press, while forming the downwardly extending edge portions 236 of the cover 232 and the peripheral walls 224 of the frame 222.

Referring to FIG. 4, the progressive die completes the fabrication of the frame 222 and cover 232 by stamping out the adjoining portion of material 248 connecting the frame 222 and cover 232, thus separating the frame 222 from the cover 232 with a minimum (or at least reduced) width between the frame 222 and cover 232. For example, the width of the stamped opening between the frame 222 and cover 232 may be a fractional amount of the wavelength of the electromagnetic radiation emitted by the electrical component to be enclosed by the shield 220, and for a wireless communication device may be on the order of about one to several millimeters.

In various embodiments, the frame's inner sidewalls 228 can also be configured to close off or seal the interface or open area generally between the cover's edge portions 236 and the frame's outer sidewalls 227. This feature can substantially eliminate (or at least reduce) gaps between the cover's edge portions 236 and the frame's outer sidewalls 227. This, in turn, can inhibit electromagnetic energy from passing through or leaking out of the gaps or interfaces, thus providing better shielding. Accordingly, aspects of the invention provide an EMI shield 220 assembly with a replaceable cover 232 that may be made with substantially no gaps between the cover's edge portions 236 and the frame's outer sidewalls 227 to provide better EMI shielding of an enclosed component, wherein the two pieces may be nested as one piece to permit progressive stamping of both the cover 232 and frame 222 from the same single strip of material with minimal (or at least reduced) material fall-off. The progressive stamping produces a cover 232 that is adapted to be releasably attached to the frame 222, such that the cover portion 232 may be readily, removed and replaced.

In another aspect, the present invention provides methods of making or fabricating EMI shields. In one particular embodiment, the method generally includes stamping in a piece material a partial profile flat pattern for a frame 222 and a cover 232. The partial profile for the frame 222 includes peripheral walls 224 each having at least one opening 230 therein. The partial profile for the cover portion 232 has a plurality of edge portions 236, each of which have at least one dimple 240 formed therein. The partial profile for the cover 232 is disposed within the area defined by frame's perimeter walls 224, such that the cover 232 may be stamped within the area of material that is generally surrounded by and defined between the frame's walls 224.

After stamping the partial flat pattern profile for the frame 222 and cover 232 in the piece of material, folded portions 226 are formed in each of the frame's perimeter walls 224. This operation provides each wall 224 with outer and inner sidewalls 227 and 228, with the inner sidewalls 228 including at least one opening 230. Each inner sidewall 228 is generally parallel with the corresponding outer sidewall 227, and overlaps at least part of the corresponding edge portion 236 of the cover 232. Forming the folded portions 226 also locates the openings 230 in the inner sidewalls 228 such that the openings 230 are disposed around the corresponding dimples 240 in the cover's edge portions 236.

The method may also include bending each frame wall 224 and each cover edge portion 236 generally perpendicular to the cover 232. This bending operating can be performed such that the openings 230 in the frame's inner sidewalls 228 remain adjacent to and disposed generally around the dimples 240 in each edge portion 236 of the cover 232.

The method can also include stamping the remaining profile of the frame 222 and the cover 232 to form two separable frame and cover pieces. The stamping removes material 248 connecting and disposed between the frame 222 and the cover 232. This stamping operation can be performed such that each dimple 240 is retained within the corresponding opening 230. The stamping can also remove any carrying corners that may have been used to support the frame 222.

Referring to FIG. 5, a cut-away view of the cover 232 shows the generally curved cross-section of the downwardly extending edge portions 236 of the cover 232 including at least one dimple 240. The cross-section of the dimples 240 are also shown disposed within the at least one opening 230 in the inner sidewalls 228 of the frame 222.

In this particular embodiment, the spacing between dimples 240 on opposing edge portions 236 are such that a slight interference fit with the frame inner sidewalls 228 is provided. The distance between the opposing dimples 240 can be a predetermined distance that will suitably fit over the frame perimeter walls 224 with a nominal or relatively low downward force. In one embodiment, the dimples 240, openings 230 and the predetermined distance between dimples 240 are configured such that there is provided a slight interference with the frame's walls 224 when the cover 232 is slid onto the frame 222. In various embodiments, a force in the range of about one pound to about five pounds may be required to slide the cover 232 onto or off the frame 222.

The generally curved shape of the formed cover edge portions 236 can also allow the cover's edge portions 236 to gradually deflect and spread apart while the cover 232 is being slid on and off of the frame 222.

FIGS. 6 through 12 illustrate another exemplary embodiment of an EMI shield 320 embodying one or more aspects of the invention. As shown, the EMI shield 320 includes a frame 322 and a cover 332 removably attachable to the frame 322. The frame 322 includes one or more peripheral walls 324. Each wall 324 includes a folded portion 326 bent to form generally vertical outer and inner sidewalls 327 and 328. The outer and inner sidewalls 327 and 128 are generally parallel with one another.

While the illustrated frame 322 has four peripheral walls 324 in a generally rectangular configuration, other embodiments can include a frame having more or less than four peripheral walls and/or peripheral walls in a non-rectangular configuration (e.g., triangular, hexagonal, circular, etc.). For example, FIG. 1 illustrates an EMI shield 20 including a frame 22 with three peripheral walls 24 arranged in a generally triangular configuration.

With continued reference to FIGS. 6 through 12, each of the frame's inner sidewalls 328 includes openings 330 for receiving corresponding dimples, detents, or protrusions 340 of the cover 332. In this particular embodiment, each of the frame's inner sidewalls 328 includes three circular through-holes 330. Alternative embodiments include more or less than three openings (and in some cases no openings) in an inner sidewall, and/or openings that do not extend completely through the inner sidewalls. Plus, each of the frame's inner sidewalls does not need to include the same number of openings as the other inner sidewalls of the frame. In yet other embodiments, one or more of the openings in the frame inner sidewalls may be configured with a non-circular shape, such as a relatively oblong opening, slot, notch, hole, recess, rectangular opening, etc.

The shield 320 also includes the cover 332 that can be removably attached to the frame 322. The cover 332 includes a lid portion 334 and edge portions 336 extending downwardly from the lid portion 334.

In this particular embodiment, the cover 332 includes holes 337. These holes 337 can allow airflow for ventilation to help cool the circuit elements or devices covered by the shield 320. The holes 337 may also permit visual inspection of the portions of the devices (e.g., transceiver circuits) underneath the shield 320 without having to remove the cover 332. In various embodiments, the holes 337 are generally sufficiently small to prevent passage of interfering electromagnetic interference. The particular number, size, arrangement, and shape of the holes 337 can be varied and tailored to a particular application, such as tailoring based on sensitivity of the portion of the transceiver circuit beneath the shield 320. By way of example only, the diameter of the holes 337 can be made smaller for more sensitive circuitry.

The cover's edge portions 336 include dimples 340 configured to be engagingly received in the openings 330 in the frame's inner sidewalls 328. In the illustrated embodiment, each of the cover's edge portions 336 includes three dimples 340 configured to be engagingly received in the corresponding openings 330 in the frame's inner sidewalls 328. Alternatively, other embodiments can include a cover having more or less than three dimples (and in some cases no dimples) on each of the cover's edge portions. Plus, each cover edge portion does not need to include the same number of dimples as the cover's other edge portions. In yet other embodiments, one or more of the dimples may be engagingly received in an opening other than a circular through-hole, such as a relatively long opening or slot in a frame inner sidewall.

The shield 320 and its dimples 340 are configured (e.g., shaped, sized, and spaced apart from one another on the edge portions 336) such that the dimples 340 can be slid over the frame's inner sidewalls 328 to engage the openings 330 of the frame's inner sidewalls 328. In one exemplary embodiment, the cover's edge portions 336 may flex outwardly and/or the frame's peripheral walls 324 may flex inwardly as the dimples 340 are slid over the frame's inner sidewalls 328 for engaging the openings 330. The cover 332 can thus be releasably retained to the frame 322 by the engagement of the dimples 340 within the openings 330 in the frame's inner sidewalls 328. This, in turn, provides an EMI shield 320 having a cover 332 that may be readily removed from the frame 322, for example, to allow access to components under the cover 332. The cover 332 may subsequently be reattached to the frame 322, or a new cover 332 may be assembled onto the frame 322. Accordingly, various embodiments of the present invention can help avoid the access problems associated with soldered shields by providing shields that can be readily opened when repair work is necessary or desired.

In various embodiments, the cover 332 and dimples 340 can be integrally or monolithically formed as a single component. One exemplary implementation stamps the dimples 340 into the cover 332. Other suitable manufacturing processes besides stamping can also be used to integrally form the cover and the dimples as a single component.

Even though the dimples 340 can be formed integrally with the cover 332, such is not required. In other embodiments, the dimples 340 may comprise discrete components that are separately engaged to the cover 332 (or to the frame 322 as the case may be), for example, by welding, among other suitable methods.

In the illustrated embodiment of FIGS. 6 through 12, the cover 332 includes dimples 340 and the frame 332 includes openings 330. Other embodiments can include the frame having one or more dimples, and the cover having one or more openings. In further embodiments, different combinations of dimples and openings can be defined by either or both the frame and the cover depending on the particular application.

A wide range of materials can be used for the shield 320. In one embodiment, the frame 322 and cover 332 are both formed of tin-plated cold rolled steel. Alternatively, the frame 322 and cover 332 may be made of nickel-silver alloy, stainless steel, carbon steel, or other suitable electrically conductive and/or non-magnetic material suitable for use as an EMI shield.

In various embodiments, the cover portion 332 may be relatively easily removed from and reattached to the frame 322. In one particular embodiment, the shield 320 is configured such that its cover 332 may be releasably removed from the frame 322 when a force in the range of about one pound to about five pounds is applied to the cover 332. This allows the cover 332 to be relatively easily removed from the frame 322, for example, to permit rework or replacement of electrical components that may lie under the cover 332 on a printed circuit board, without requiring any severing or breaking off of a separate portion of the cover. By virtue of the low force required to remove the cover in such exemplary embodiments, the cover may also be removable without the use of tools.

In various embodiments, the contact established between the cover 332 and the frame 322 provides an effective amount of electrical conduction between the cover 332 and the frame 322 for conducting electromagnetic energy absorbed by the shield to a ground plane on a printed circuit board.

In various embodiments, the cover 332 when releasably retained to the frame 322 can provide an EMI shield 320 with a height of not more than about four millimeters, while providing accessibility to objects that are enclosed beneath the removable cover 332 of the EMI shield 320. In one particular embodiment, a shield having a height of about three millimeters is provided. In another embodiment, a shield having a height of about six millimeters is provided. Accordingly, various embodiments of the present invention can provide an EMI shield with a removable cover with reduced gaps or spaces for inadvertent escape of electromagnetic interference between the frame and the cover. The dimensions set forth in this paragraph (as are all dimensions herein) are provided for illustrative purposes only, and not for purposes of limitation.

In various embodiments, each inner sidewall 328 may further comprise at least one folded upper surface 342 (FIG. 12) that is generally perpendicular to the inner sidewall 328. The upper surface 342 is spaced above the at least one opening 330 in the inner sidewall 328 such that the lid portion 334 of the cover 332 contacts the upper surface 342 when each dimple 340 is received within the corresponding opening 330. This, in turn, may help retain the cover 332 to the frame 322 in a more secure manner.

With continued reference to FIGS. 6 through 12, the frame 322 includes perimeter walls 324 having mounting feet 344 for contacting one or more components of a printed circuit board (not shown) to establish or provide for electrical contact with the printed circuit board. The dimples 340 can help establish electrical conduction between the cover 332 and the frame's inner sidewalls 328. Where the inner sidewalls 328 include at least one upper surface 342 perpendicular to the inner sidewall 328, electrical contact can also be established between the inner surface or underside of the cover's lid portion 334 and the at least one upper surface 342 of the frame's inner sidewall 328.

The top surface of the frame 322 also helps to establish good electrical contact with the underside of the cover's planar top 334 when the cover 332 is retained on the frame 322 via the engagement of the dimples 340 and openings 330. The contact area established between the cover's planar top 334 and the frame 322 can help form an electrically conductive pathway that provides an effective amount of electrical conduction between the cover 332 and frame 322 for conducting electromagnetic energy absorbed by the shield 320 through the mounting feet 344 to a ground plane on a printed circuit board.

The frame 322 may be made of a material suitable for soldering the feet 344 to traces on a printed circuit board. Exemplary materials for the frame 322 include cold rolled steel, nickel-silver alloy, or the like. Alternative materials for the frame 322 include carbon steel, stainless steel, tin-plated cold rolled steel, etc.

While the feet 344 of the frame 322 can be soldered to a printed circuit board (PCB), the frame 322 may also be affixed to a circuit board by any suitable manner desired, such as adhesives, mechanical fasteners, clips, etc. In one embodiment, the frame 322 may be attached to a PCB via soldering the mounting feet 344 to grounded traces positioned on the PCB substrate and/or around the electrical circuits generating (or requiring protection from) electromagnetic interference as well as around the electrical circuits that are susceptible to interference.

Figure 13:
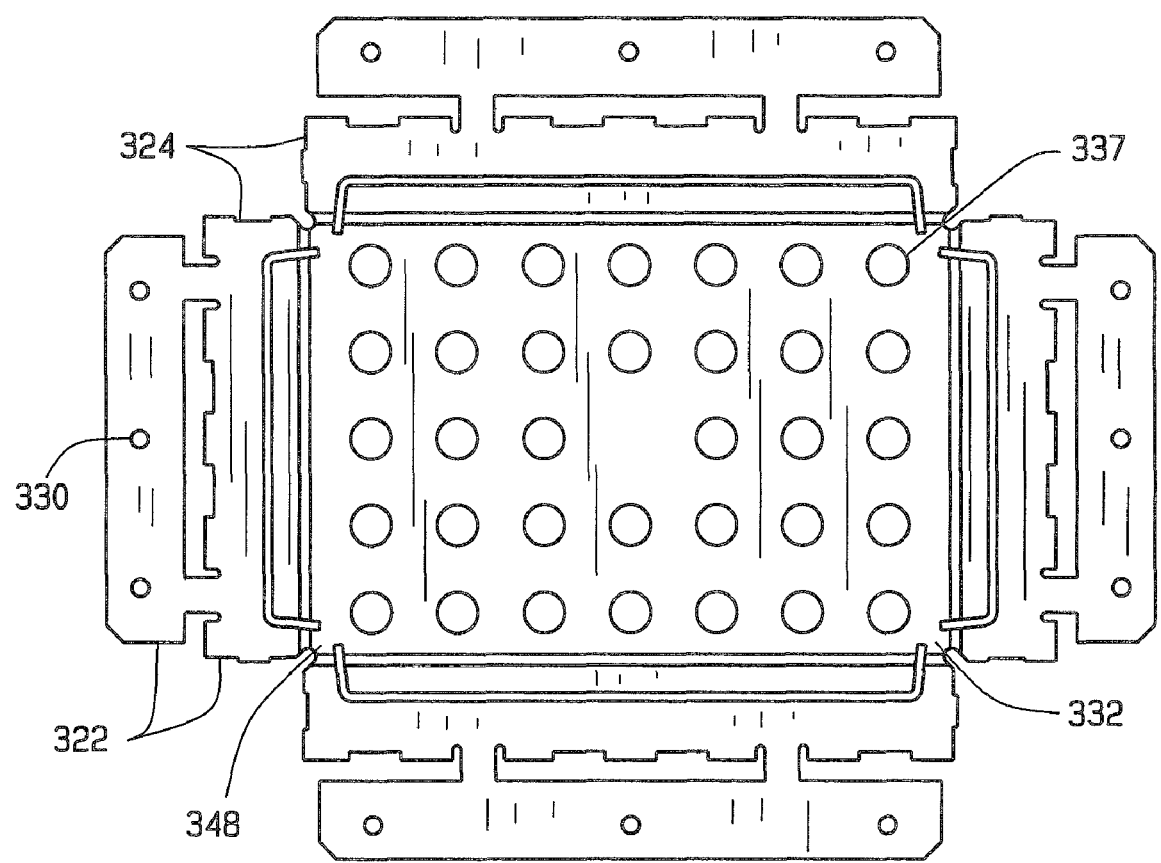
FIG. 13 is plan view of a blank including a flat pattern partial profile that can be used to make the EMI shield shown in FIGS. 6 through 12 according to one exemplary embodiment of the invention.

In various embodiments, the shield 320 may be fabricated from a single blank of material. As shown in FIG. 13, the frame 322 and the cover 332 can be sized such that the cover 332 may be disposed within or nested in the area of material within the frame 322, thereby allowing the frame 322 and cover 332 to be fabricated from the same single blank or strip of material.

Other embodiments of an EMI shield may include a plurality of carrying corners to permit fabrication of the shield 320 through a progressive die stamping process. In such embodiments, the carrying corners may allow the frame 322 being stamped to be retained within the raw material strip that is fed through the progressive die press, while forming the downwardly extending edge portions 336 of the cover 332 and the peripheral walls 324 of the frame 322. Some embodiments can allow for fabricating the cover's edge portions with a minimum (or at least reduced) corner fillet radius using a progressive die, for example, to enable a cost effective cover design that will provide a shield having a height of not more than about six millimeters with a 0.25 millimeter corner fillet radius. In another embodiment, a shield having a height of about three millimeters is provided. The dimensions set forth in this paragraph (as are all dimensions herein) are provided for illustrative purposes only, and not for purposes of limitation.

With continued reference to FIG. 13, the progressive die may complete the fabrication of the frame 322 and cover 332 by stamping out the adjoining portion of material 348 connecting the frame 322 and cover 332, thus separating the frame 322 from the cover 332 with a minimum (or at least reduced) width between the frame 322 and cover 332. For example, the width of the stamped opening between the frame 322 and cover 332 may be a fractional amount of the wavelength of the electromagnetic radiation emitted by the electrical component to be enclosed by the shield 320, and for a wireless communication device may be on the order of about one to several millimeters.

In various embodiments, the frame's inner sidewalls 328 can be configured to close off or seal the interface or open area generally between the cover's edge portions 336 and the frame's outer sidewalls 327. In such embodiments, portions of the frame's inner sidewalls 328 can be located immediately behind the gap or interface between the cover's edge portions 336 and the frame's outer sidewalls 327. This feature can substantially eliminate (or at least reduce) gaps between the cover's edge portions 336 and the frame's outer sidewalls 327. This, in turn, can inhibit electromagnetic energy from passing through or leaking out of the gaps or interfaces, thus providing better shielding. Accordingly, aspects of the invention provide an EMI shield 320 assembly with a replaceable cover 332 that may be made with substantially no gaps between the cover's edge portions 336 and the frame's outer sidewalls 327 to provide better EMI shielding of an enclosed component, wherein the two pieces may be nested as one piece to permit progressive stamping of both the cover 332 and frame 322 from the same single strip of material with minimal (or at least reduced) material fall-off. The progressive stamping produces a cover 332 that is adapted to be releasably attached to the frame 322, such that the cover portion 332 may be readily, removed and replaced.

In another aspect, the present invention provides methods of making or fabricating EMI shields, such as shield 320. In one particular embodiment, the method generally includes stamping in a piece material a partial profile flat pattern for a frame 322 and a cover 332. As shown in FIG. 13, the partial profile for the frame 322 includes peripheral walls 324 each having at least one opening 330 therein. The partial profile for the cover portion 332 has a plurality of edge portions 336. Dimples 340 and vent holes 337 can also be formed in the cover portion 332. The partial profile for the cover 332 is disposed within the area defined by frame's perimeter walls 324, such that the cover 332 may be stamped within the area of material that is generally surrounded by and defined between the frame's walls 324.

After stamping the partial flat pattern profile for the frame 322 and cover 332 in the piece of material, folded portions 326 are formed in each of the frame's perimeter walls 324. This operation provides each wall 324 with outer and inner sidewalls 327 and 328, with the inner sidewalls 328 including at least one opening 330. Each inner sidewall 328 is generally parallel with the corresponding outer sidewall 327, and overlaps at least part of the corresponding edge portion 336 of the cover 332. Forming the folded portions 326 also locates the openings 330 in the inner sidewalls 328 such that the openings 330 are disposed around the corresponding dimples 340 in the cover's edge portions 336.

The method may also include bending each frame wall 324 and each cover edge portion 336 generally perpendicular to the cover 332. This bending operating can be performed such that the openings 330 in the frame's inner sidewalls 328 remain adjacent to and disposed generally around the dimples 340 in each edge portion 336 of the cover 332.

The method can also include stamping the remaining profile of the frame 322 and the cover 332 to form two separable frame and cover pieces. The stamping removes material 348 connecting and disposed between the frame 322 and the cover 332. This stamping operation can be performed such that each dimple 340 is retained within the corresponding opening 330. The stamping can also remove any carrying corners that may have been used to support the frame 322.

Accordingly, various embodiments can provide an EMI shield having a cover that can be assembled onto and removed from a frame without requiring a tool to pry the cover away from the frame. In such embodiments, the dimples can permit the cover to be easily slid off the frame by hand without any tools. With this unique feature, various embodiments of the present invention include EMI shields with removable covers that are releasably retained in a manner such that removal and rework of electrical components within the frame is more simply accomplished. The removal of the cover can also be accomplished without causing damage or deformation of the cover. Such deformation has come to be expected with existing designs by reason of excessive deflection of the cover's sides during removal and/or by reason of line workers using improper techniques of lid removal to save time (e.g., using the worker's thumbnail to pry off the lid). Accordingly, various embodiments of the present invention allow the same cover to be removed from a frame and then be reattached to the frame without requiring a replacement cover or replacement of the entire shield.

The particular methods of manufacture and geometries disclosed herein are exemplary in nature and are not to be considered limiting. The steps, processes, and operations described herein are not to be construed as necessarily requiring their performance in the particular order discussed or illustrated, unless specifically identified as an order or performance. It is also to be understood that additional or alternative steps may be employed. In addition, any one or more aspects of the invention may be implemented individually or in any combination with any one or more of the other aspects of the invention.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present invention and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted.

It is further to be understood that the method steps, processes, and operations described herein are not to be construed as necessarily requiring their performance in the particular order discussed or illustrated, unless specifically identified as an order or performance. It is also to be understood that additional or alternative steps may be employed.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of making an electromagnetic interference shield including a frame and a cover, the method comprising:

forming in a single piece of material a flat pattern partial profile for the frame and the cover, the profile for the frame including a plurality of peripheral walls, and the profile for the cover including a plurality of edge portions, the profile for the cover being disposed within the area generally defined between the frame's peripheral walls;

forming at least one folded portion in at least one peripheral wall of the frame to thereby provide the at least one peripheral wall with an outer sidewall and an inner sidewall;

bending the frame's peripheral walls and the cover's edge portions generally perpendicular to the cover; and removing the remaining material connecting the frame to the cover to thereby form two separable frame and cover pieces.

2. The method of claim 1, wherein forming at least one folded portion in at least one peripheral wall of the frame further comprises forming at least one other folded portion in the at least one peripheral wall to thereby provide the at least one peripheral wall with an upper surface generally perpendicular to said inner and outer sidewalls for contacting an underside of the cover's lid portion when the cover is releasably retained to the frame.

3. The method of claim 2, wherein forming at least one folded portion in the at least one peripheral wall of the frame includes bending the at least one peripheral wall about one hundred eighty degrees to thereby provide the at least one peripheral wall with the outer and inner sidewalls, and bending an upper portion of the inner sidewall about ninety degrees to provide the at least one peripheral wall with the generally perpendicular upper surface.

4. The method of claim 1, wherein forming in the single piece of material the flat pattern partial profile for the frame and the cover comprises:
stamping the profile for the frame such that at least one of the peripheral walls includes at least one of a dimple and an opening; and
stamping the profile for the cover such that at least one of the edge portions includes at least one of the other of said dimple and said opening.

5. The method of claim 4, wherein after forming the at least one folded portion in at least one peripheral wall of the frame, the inner sidewall includes the at least one of said dimple and said opening folded over and engaged with the at least one of the other of said dimple and said opening of the cover.

6. The method of claim 5, wherein after removing the remaining material connecting the frame to the cover to thereby form two separable frame and cover pieces, the cover is releasably retained to the frame by the engagement of the at least one dimple with the at least one opening.

7. The method of claim 1, wherein removing comprises stamping to remove removing the remaining material connecting the frame to the cover to thereby form two separable frame and cover pieces.

8. The method of claim 1, wherein:
the profile for the frame includes a first retaining feature; and
the profile for the cover includes a second retaining feature engageable with the first retaining feature, such that the cover is releasably retained to the frame by the engagement of the first and second retaining features after removing the remaining material connecting the frame to the cover.

9. The method of claim 8, wherein:
the first retaining feature includes at least one of a dimple and an opening; and
the second retaining feature includes the other one of said dimple and opening.

10. The method of claim 8, wherein forming in the single piece of material the flat pattern partial profile for the frame and the cover comprises:
stamping the profile for the frame such that at least one of the peripheral walls includes the first retaining feature; and
stamping the profile for the cover such that at least one of the edge portions includes the second retaining feature.

11. The method of claim 8, wherein the first and second retaining features are stamped in the single piece of material.

12. The method of claim 8, wherein the first and second retaining features comprise one or more of an opening, slot, notch, recess, dimple, detent, and protrusion.

13. The method of claim 8, wherein after forming the at least one folded portion in at least one peripheral wall of the frame, the inner sidewall includes the first retaining feature folded over and engaged with the second retaining feature of the cover.

14. The method of claim 1, wherein the method includes progressive die stamping.

15. The method of claim 1, wherein the frame's outer sidewall, folded portion, and inner sidewall collectively have a generally U-shaped profile.

16. A method of making an electromagnetic interference shield including a frame and a cover, the method comprising:
forming in a single piece of material a flat pattern partial profile for the frame and the cover, the profile for the frame including a plurality of peripheral walls, the profile for the cover having a plurality of edge portions, the profile for the cover being disposed within the area defined generally within the frame's peripheral walls;
forming bends in the frame's peripheral walls to thereby form at least one tab surface generally perpendicular to the peripheral walls;
forming folded portions in the frame's peripheral walls to thereby provide the peripheral walls with an outer sidewall and an inner sidewall;
bending the frame's peripheral walls and the cover's edge portions generally perpendicular to the cover; and
removing the remaining material connecting the frame to the cover to thereby form two separable frame and cover pieces.

17. The method of claim 16, wherein forming folded portions includes bending the peripheral walls about one hundred eighty degrees to provide each said peripheral wall with an outer sidewall and an inner sidewall.

18. The method of claim 17, wherein forming folded portions occurs before forming bends.

19. The method of claim 16:
wherein forming in the single piece of material the flat pattern partial profile for the frame and the cover comprises:
forming the profile for the frame such that at least one of the peripheral walls includes at least one of a dimple and an opening; and
forming the profile for the cover such that at least one of the edge portions includes at least one of the other of said dimple and said opening;
wherein after forming the at least one folded portion in at least one peripheral wall of the frame, the inner sidewall includes the at least one of said dimple and said opening folded over and engaged with the at least one of the other of said dimple and said opening of the cover; and
wherein after removing the remaining material connecting the frame to the cover to thereby form two separable frame and cover pieces, the cover is releasably retained to the frame by the engagement of the at least one dimple with the at least one opening.

20. The method of claim 16, wherein:
wherein forming in the single piece of material the flat pattern partial profile for the frame and the cover comprises:
forming the profile for the frame such that at least one of the peripheral walls includes a first retaining feature; and
forming the profile for the cover such that at least one of the edge portions includes a second retaining feature;
wherein after forming the at least one folded portion in at least one peripheral wall of the frame, the inner sidewall includes the first retaining feature folded over and engaged with the second retaining feature; and
wherein after removing the remaining material connecting the frame to the cover to thereby form two separable frame and cover pieces, the cover is releasably retained to the frame by the engagement of the first retaining feature with the second retaining feature.

21. The method of claim 20, wherein:
the first retaining feature includes at least one of a dimple and an opening; and
the second retaining features include the other one of said dimple and opening.

22. A method of making an electromagnetic interference shield having a frame and a cover from a generally flat blank including a flat pattern partial profile for the frame and the cover, the method comprising:
forming outer portions of the blank generally inwardly about one hundred eighty degrees to thereby form the frame's outer and inner sidewalls;
forming upper portions of the frame's inner sidewalls outwardly about ninety degrees to thereby form surfaces generally perpendicular to the frame's inner sidewalls;
forming the frame's inner and outer sidewalls and portions of the blank defining the cover's edge portions inwardly about ninety degrees; and
severing the remaining material of the blank connecting the frame to the cover to thereby form two separable frame and cover pieces.

23. The method of claim 22, further comprising forming in the blank at least one opening and at least one dimple such that at least one of said dimple and said opening is folded over and engaged with the other of said dimple and said opening when the outer portions of the blank are formed inwardly about one hundred eighty degrees.

24. The method of claim 22, further comprising forming in the blank first and second retaining features such that the first retaining feature is folded over and engaged with the second retaining feature when the outer portions of the blank are formed inwardly about one hundred eighty degrees.

* * * * *